United States Patent
Jhang et al.

(10) Patent No.: US 8,831,052 B2
(45) Date of Patent: Sep. 9, 2014

(54) APPARATUS FOR GENERATING SHORT-PULSE LASER USING TEMPORALLY MODULATED SIDEBAND GAIN

(71) Applicant: Industrial Technology Research Institute, Hsin-Chu (TW)

(72) Inventors: Yao-Wun Jhang, Chiayi (TW); Chien-Ming Huang, Taipei (TW); Hsin-Chia Su, Yunlin County (TW); Shih-Ting Lin, Tainan (TW); Chih-Lin Wang, Tainan (TW); Hong-Xi Tsau, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/903,857

(22) Filed: May 28, 2013

(65) Prior Publication Data
US 2014/0153597 A1    Jun. 5, 2014

(51) Int. Cl.
*H01S 3/10* (2006.01)
*H01S 5/06* (2006.01)

(52) U.S. Cl.
CPC ........................ *H01S 5/06* (2013.01)
USPC ...................... 372/25; 372/6; 372/26; 372/30

(58) Field of Classification Search
USPC ........................................................ 372/25
See application file for complete search history.

(56) References Cited

U.S. PATENT DOCUMENTS

| 5,177,752 A | 1/1993 | Ohya et al. |
| 5,339,323 A | 8/1994 | Hunter et al. |

(Continued)

FOREIGN PATENT DOCUMENTS

| CN | 101900608 A | 12/2010 |
| CN | 102625923 A | 8/2012 |
| TW | 508879 B | 11/2002 |
| TW | I294228 B | 3/2008 |

OTHER PUBLICATIONS

Teodoro et al.,"Photonic-crystal fiber amplifier generating 1.1-MW peak-power, spectrally narrow, diffraction-limited pulses at 1064 nm", Lasers and Electro-Optics, 2005. CLEO/Pacific Rim 2005, pp. 406-407, Aug. 2005.

Wright et al., "A Fiber-Based Master Oscillator Power Amplifier Laser Transmitter for Optical ommunications", IPN Progress Report 42-171, pp. 1-18, Nov. 15, 2007.

Dupriez et al., "High Average Power, High Repetition Rate, Picosecond Pulsed Fiber Master Oscillator Power Amplifier Source Seeded by a Gain-Switched Laser Diode at 1060 nm", IEEE Photonics Technology Letters, vol. 18, No. 9, pp. 1013-1015, May 1, 2006.

(Continued)

*Primary Examiner* — Xinning Niu
*Assistant Examiner* — Vu A Vu
(74) *Attorney, Agent, or Firm* — Rabin & Berdo, P.C.

(57) ABSTRACT

An apparatus for generating a short-pulse laser using a temporally modulated sideband gain is provided. The apparatus includes a laser diode and an external reflector. By use of a time difference resulted by a nanosecond laser pulse signal at the external reflector, a sideband gain is obtained for generating a short-pulse picosecond laser output.

25 Claims, 10 Drawing Sheets

(56) References Cited

U.S. PATENT DOCUMENTS

| | | | |
|---|---|---|---|
| 5,365,539 A | 11/1994 | Mooradian | |
| 5,598,425 A * | 1/1997 | Jain et al. | 372/18 |
| 5,873,085 A | 2/1999 | Enoki et al. | |
| 6,373,864 B1 | 4/2002 | Georges et al. | |
| 6,757,307 B2 | 6/2004 | Hogan | |
| 6,937,626 B2 * | 8/2005 | Lou et al. | 372/6 |
| 7,058,093 B2 | 6/2006 | Kennedy et al. | |
| 7,088,756 B2 * | 8/2006 | Fermann et al. | 372/45.013 |
| 7,787,506 B1 | 8/2010 | Jiang et al. | |
| 7,940,816 B2 | 5/2011 | Nicholson | |
| 8,111,722 B1 * | 2/2012 | Maleki et al. | 372/18 |
| 8,159,736 B2 * | 4/2012 | Maleki et al. | 359/239 |
| 8,605,760 B2 * | 12/2013 | Liang et al. | 372/18 |
| 2005/0254534 A1 * | 11/2005 | Loewen et al. | 372/32 |
| 2007/0153289 A1 * | 7/2007 | Yilmaz et al. | 356/464 |
| 2009/0060526 A1 * | 3/2009 | Matsui et al. | 398/185 |
| 2011/0168913 A1 * | 7/2011 | Givon et al. | 250/458.1 |
| 2012/0294319 A1 * | 11/2012 | Maleki et al. | 372/18 |
| 2013/0259072 A1 * | 10/2013 | Maleki et al. | 372/20 |

OTHER PUBLICATIONS

Simsarian et al., "Less Than 5-ns Wavelength Switching With an SG-DBR Laser", IEEE Photonics Technology Letters, vol. 18, No. 4, pp. 565-567, Feb. 15, 2006.

Riecke et al., "Comparison of an Yb-doped Fiber and a Semiconductor Taper for Amplification of Picosecond Laser Pulses", Proc. of SPIE, vol. 7212, pp. 1-10, 2009.

Steinmetz et al., "Nonlinear compression of Q-Switched laser pulses to the realm of ultrashort durations", Optical Society of America, pp. 1-7vol. 19, No. 4, Feb. 2011.

Riecke, et al., "Amplification of ps-Pulses from freely triggerable Gain-switched Laser Diodes at 1062nm and Second Harmonic Generation in Periodically Poled Lithium Niobate", Proc. of SPIE vol. 7917, pp. 1-5, 2011.

* cited by examiner

APPARATUS FOR GENERATING SHORT-PULSE LASER USING TEMPORALLY MODULATED SIDEBAND GAIN

This application claims the benefit of Taiwan application Serial No. 101145052, filed Nov. 30, 2012, the disclosure of which is incorporated by reference herein in its entirety.

BACKGROUND

1. Technical Field

The disclosed embodiments relate in general to an apparatus for generating a laser, and more particularly to an apparatus for generating a short-pulse laser using a temporally modulated sideband gain.

2. Description of the Related Art

FIG. 1 shows a diagram of a drilling depth produced by a conventional nanosecond laser. Compared to a picosecond laser, a nanosecond laser likely causes rough burrs and renders less satisfactory laser stripping quality.

In the prior art, a picosecond laser employs techniques including gain-switched diode, diode-pumped solid-state (DPSS) laser microchip, semiconductor saturable absorber mirror (SESAM) passively mode locked, and direct diode. Among the above, the gain switched diode is prone to producing a second peak pulse tail, as shown in FIG. 2. This kind of seed has quite low pulse energy of only several pico-joules (pj) and may easily affect and thus amplify the picosecond pulse to a nanosecond scale. As a result, signal amplification is made difficult to lead to increased laser costs. Further, a shift in a central wavelength is easily affected by an ambient environment, such that a temperature of a seed source of a laser diode likely drifts to bring about an unstable laser output. In the direct diode technique of the prior art, although the direct diode can be readily combined with an optical fiber laser and has controllable optical efficiency and temperature, a short-pulse circuit driver is nevertheless extremely costly. Further, a market-available product that outputs a shortest pulse width of approximately 600 picoseconds needs to operate with a driver circuit to generate an optical pulse. In the prior art, the DPPS laser microchip is implemented by a microchip cooperating with a DPPS laser crystal. However, a pulse width produced by the DPPS laser microchip is slightly too large at approximately above 500 picoseconds.

SUMMARY

The disclosure is directed to an apparatus for generating a short-pulse laser using a temporally modulated sideband gain. An external reflector is added to cooperate with a laser diode. By use of a time difference resulted by a nanosecond electric signal and a beam travelling at the external reflector, a sideband gain is obtained for generating a short-pulse picosecond laser output. The picosecond pulse is generated by the laser diode and the external reflector without requiring a predetermined constant parameter, and has adjustable repetition rate, electric signal pulse driving time width and wavelength through modulation.

Proven by a peak power and low-heat processing, the short-pulse picosecond laser of the disclosure offers preferred processing effects than nanosecond and continuous beams with a same average power, and thus is particularly suitable for material processing, biomedical and non-linear applications. The short-pulse laser generated by the apparatus for generating a short-pulse laser using a temporally modulated sideband gain of the disclosure has a pulse width of approximately 100 picoseconds (ps), an adjustable repetition rate and pulse energy of approximately 10 nanojoules (nJ). Further, the short-pulse laser generated by the apparatus of the disclosure is outputted in a complete optical fiber having high energy stability.

According to a first embodiment, an apparatus for generating a short-pulse laser using a temporally modulated sideband gain is provided. Using a long-pulse nanosecond laser diode cooperating with an external optical fiber reflection cavity through temperature control as well as properties of programmable pulse repetition rate and pulse width, the apparatus outputs an ultra-short picosecond pulse having a pulse width of $\frac{1}{1000}$ of that of the original nanosecond laser inputted. The apparatus according to one embodiment includes at least one pulse driver modulator, a laser diode, an external reflector, and a wavelength filter. The laser diode has a $1^{st}$ end connected to the pulse driver modulator, and has a nanosecond pulse repetition rate and a pulse width of a programmable semiconductor optical output. The laser diode has a $2^{nd}$ end connected to a $3^{rd}$ end formed by an input end of the external reflector. The wavelength filter has a $5^{th}$ end connected to a $4^{th}$ end formed by an output end of the external reflector. The wavelength filter blocks a long-pulse laser signal having a first wavelength pulse, and outputs a single short-pulse laser signal having a second wavelength picosecond short pulse at a $6^{th}$ end of the wavelength filter.

According to a second embodiment, an apparatus for generating a short-pulse laser using a temporally modulated sideband gain is provided. An external reflector includes: an extension optical fiber, having one end connected to one end of the laser diode; an optical fiber coupler, having one end connected to one end of the extension optical fiber, and one other end connected to one end of the external reflector; a reflection coupler, having one end connected to one input end of a loop optical fiber and one other end connected to one output end of the loop optical fiber; and a sideband filter, having one input end connected to the loop optical fiber, for transmitting am inputted laser signal to one end thereof via one input end of the loop optical fiber, and outputting the laser signal to one output end of the loop optical fiber via one output end thereof.

According to a third embodiment, an apparatus for generating a short-pulse laser using a temporally modulated sideband gain is provided. An external reflector includes: an extension optical fiber, having one end connected to one end of a laser diode; and a second wavelength reflector, having one end connected to one end of the extension optical fiber and one other end connected to a $4^{th}$ end of the external reflector.

According to a fourth embodiment, an apparatus for generating a short-pulse laser using a temporally modulated sideband gain is provided. An external reflector includes: an extension optical fiber, having one end connected to one end of a laser diode; an optical fiber coupler, having one end connected to one end of the extension optical fiber, and one other end connected to one end of the external reflector; and a reflection mirror, having one end connected to one end of the optical fiber coupler.

Figure 1:
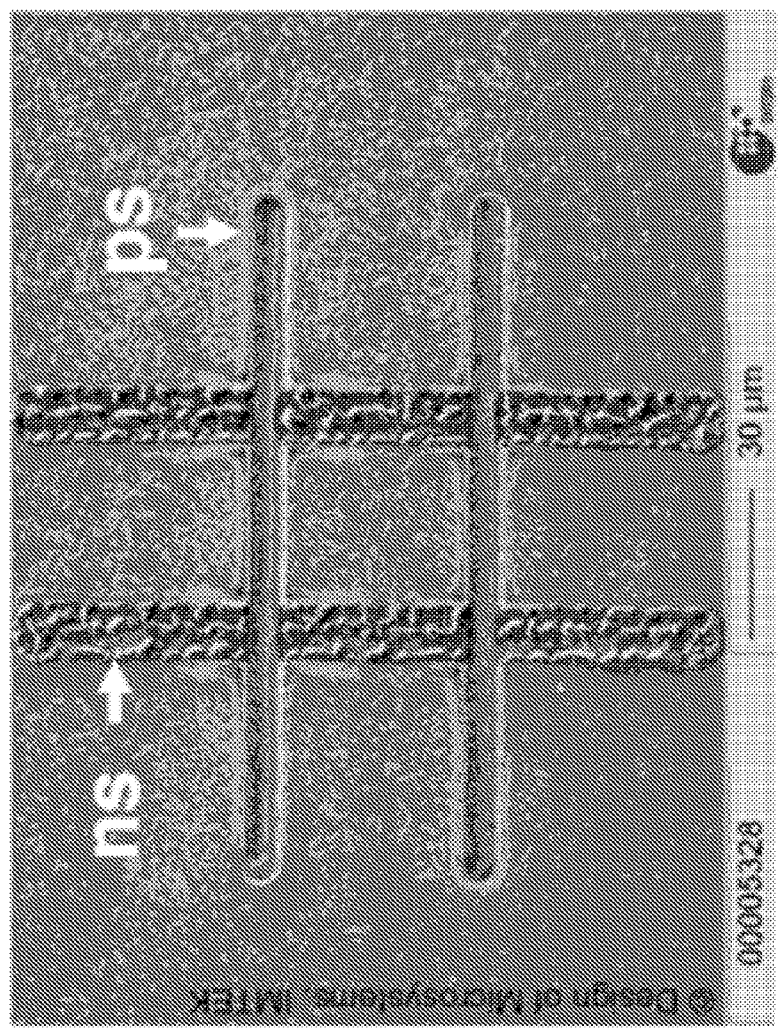
FIG. 1 a diagram comparing cutting effects of a nanosecond laser and a picosecond laser.
Figure 2:
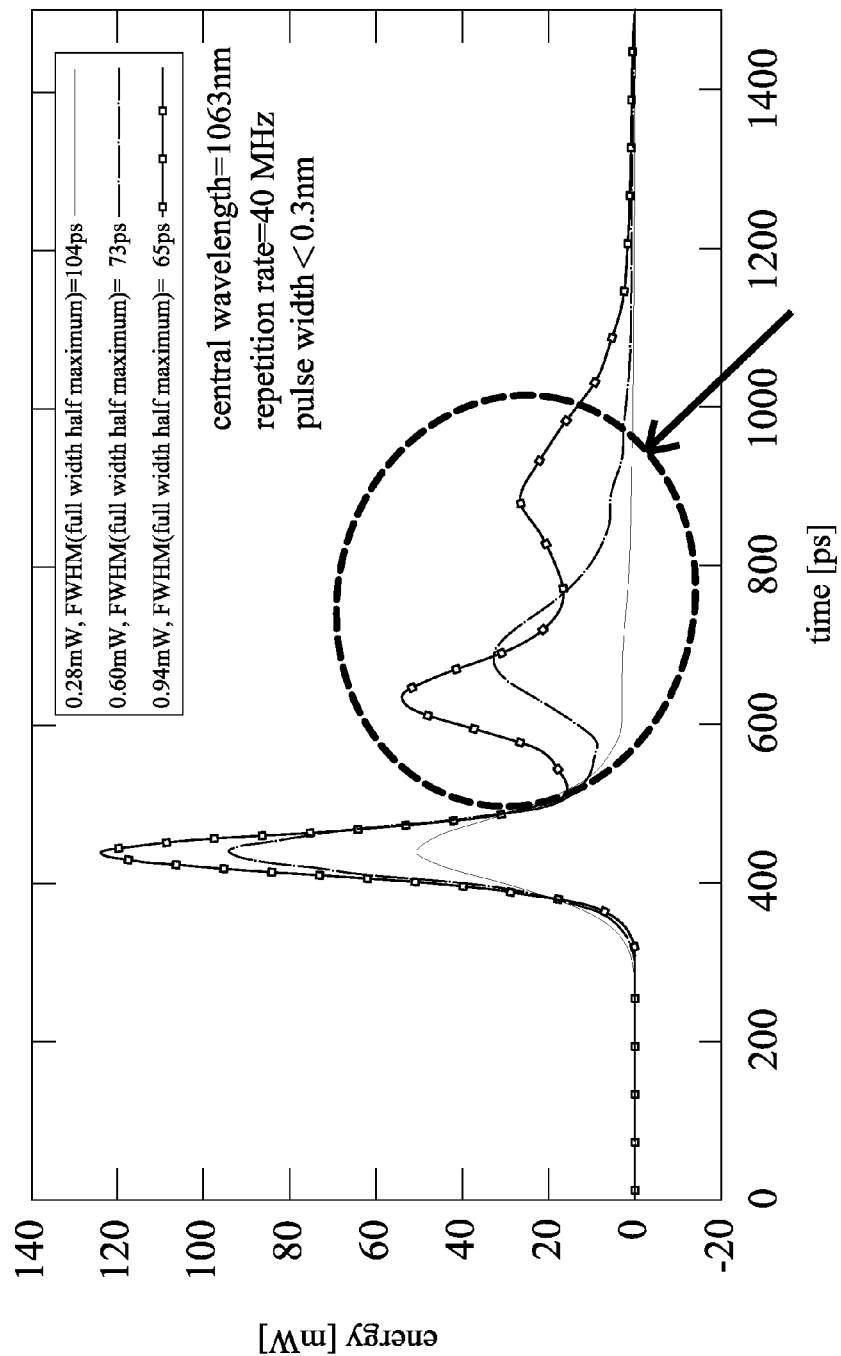
FIG. 2 is a schematic diagram of a second peak pulse tail produced by a gain switched diode.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 5:
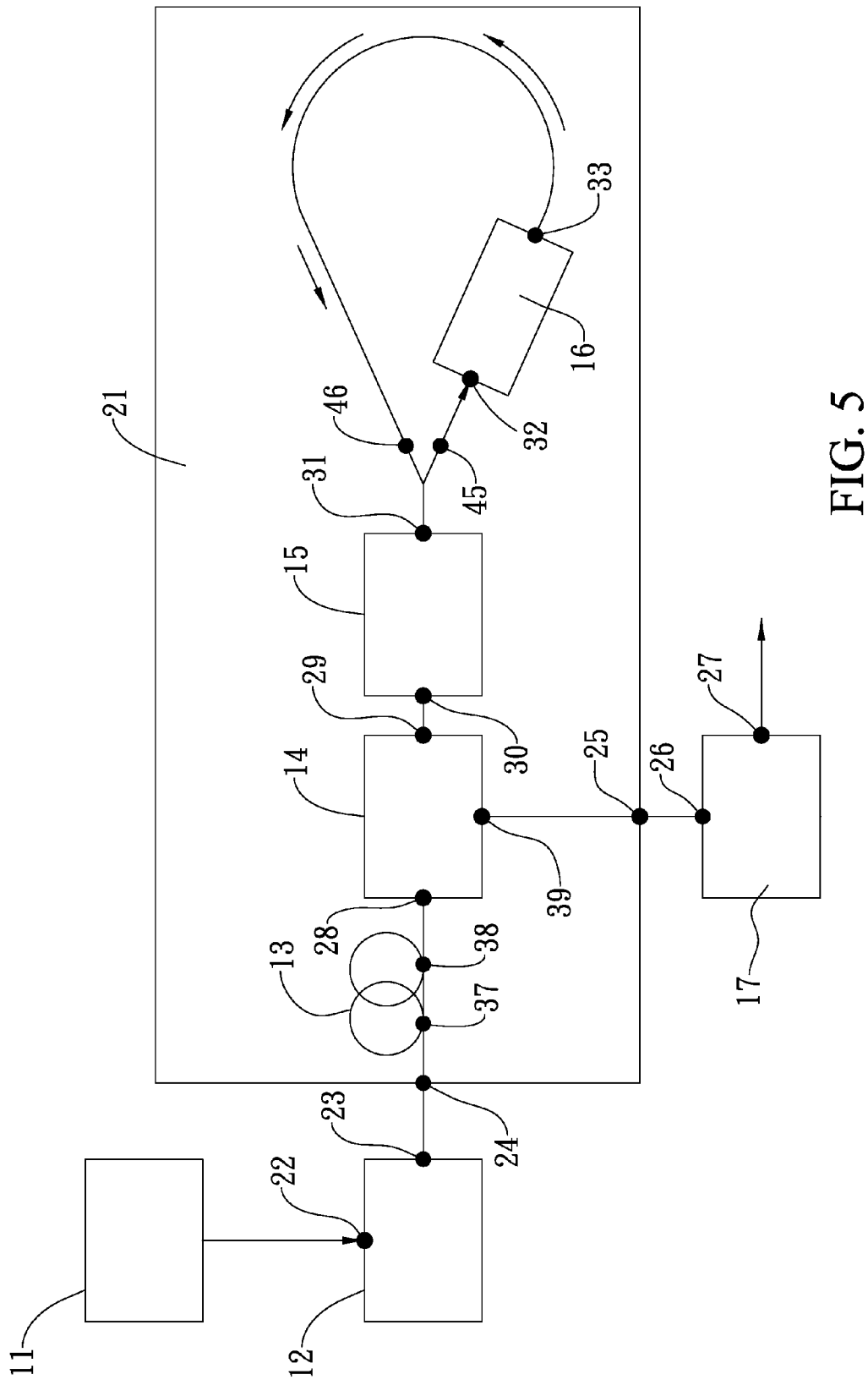
FIG. 5 is an apparatus for generating a short-pulse laser using a temporally modulated gain according to a second embodiment.
Figure 6:
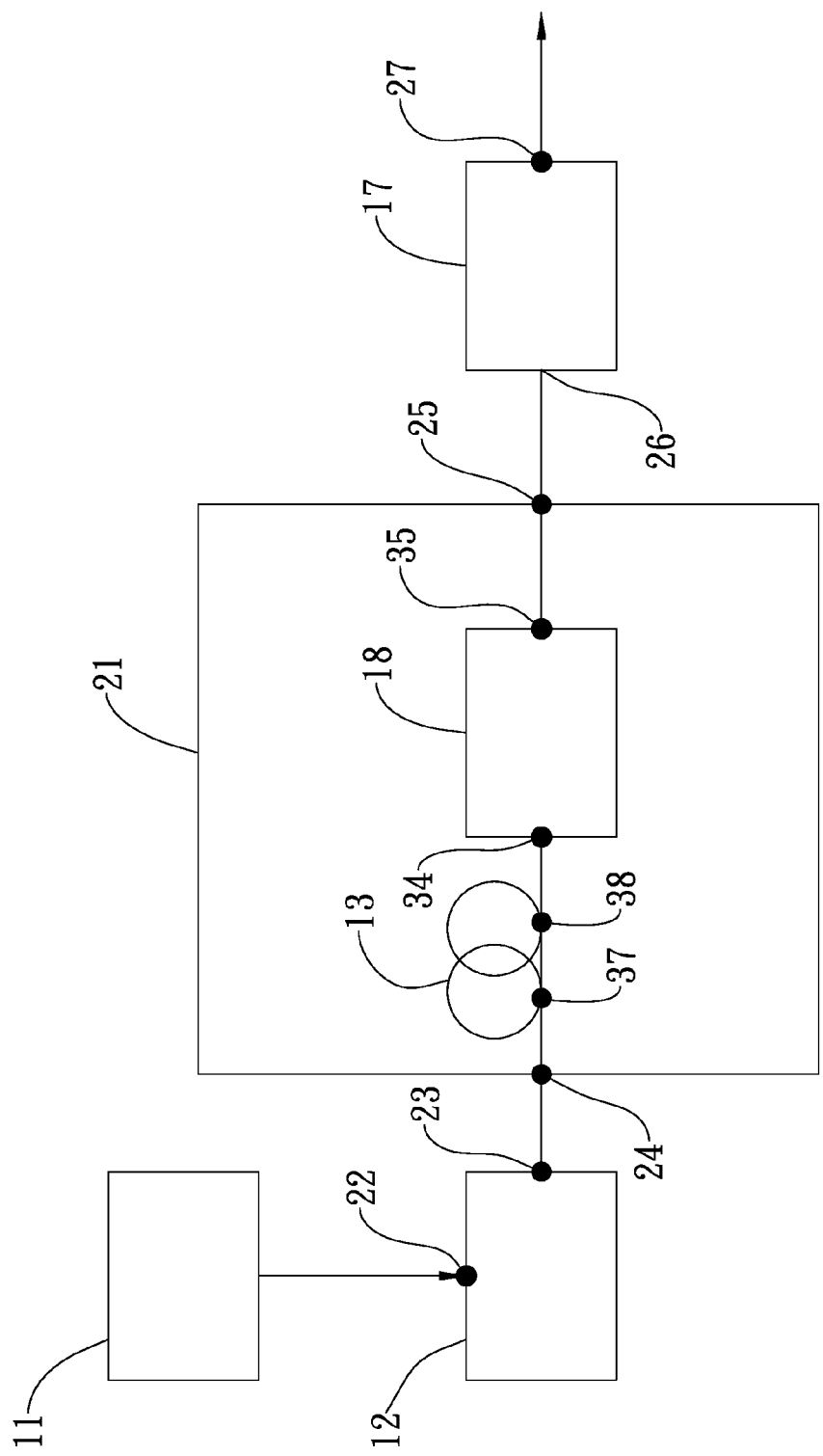
FIG. 6 is an apparatus for generating a short-pulse laser using a temporally modulated gain according to a third embodiment.
Figure 7:
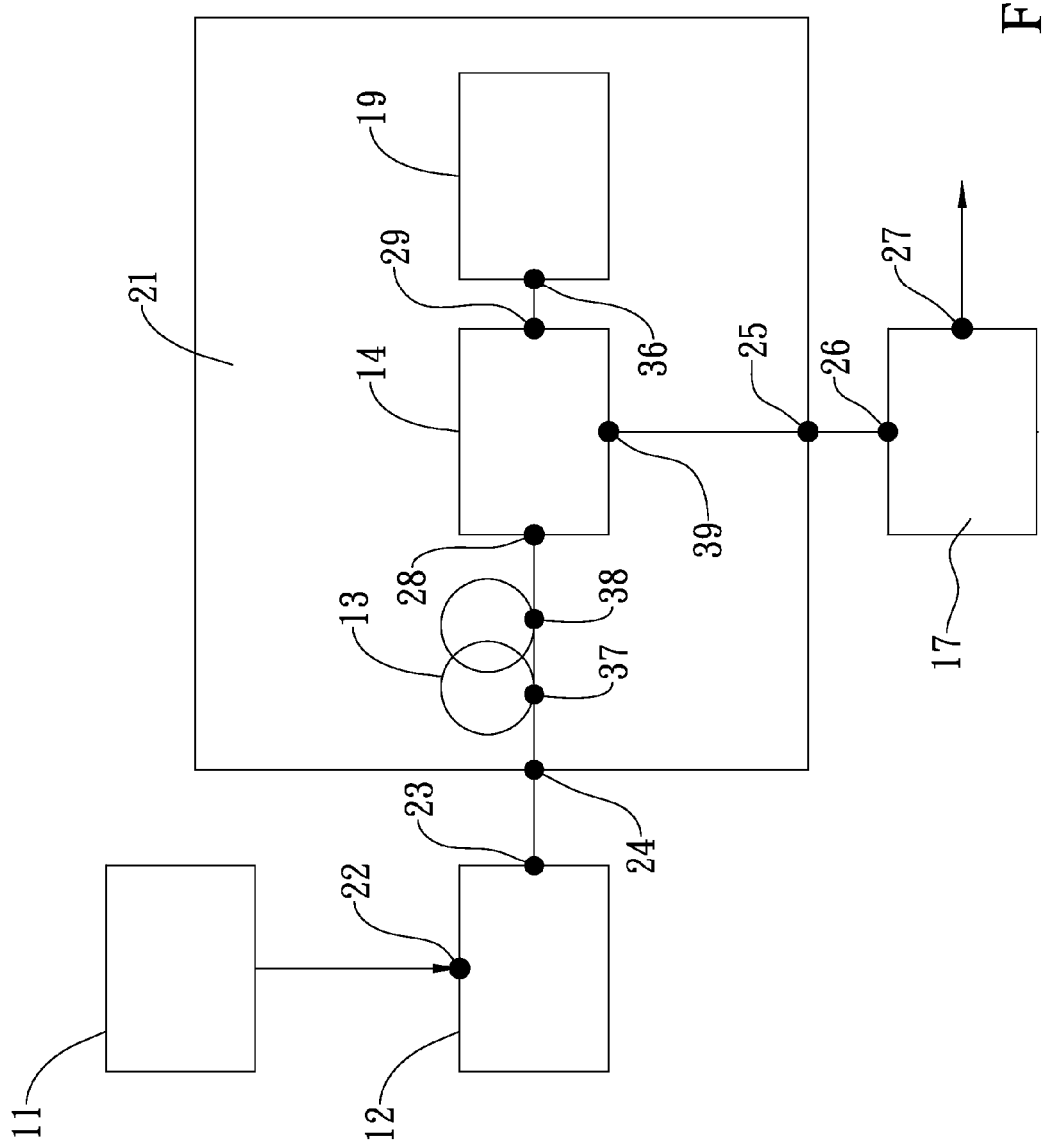
FIG. 7 is an apparatus for generating a short-pulse laser using a temporally modulated gain according to a fourth embodiment.

Referring to FIGS. 5, 6 and 7 showing different embodiments, an apparatus for generating a short-pulse laser using a temporally modulated sideband gain, the apparatus according to a first embodiment includes: at least one pulse driver modulator 11, a laser diode 12, an external reflector 21, and a wavelength filter 17. The laser diode 12 has a $1^{st}$ end 22 connected to the pulse driver modulator 11, an output end forming a $2^{nd}$ end 23 connected to a $3^{rd}$ end 24 formed by an output end of the external reflector 21, and a nanosecond pulse repetition rate and a pulse width of a programmable semiconductor optical output for cooperating with the external reflector 21. The wavelength filter 17 has a $5^{th}$ end 26 connected to a $4^{th}$ end 25 formed by an output end of the external reflector 21. The wavelength filter 17 blocks a long-pulse laser signal having a first wavelength pulse 40, and outputs a single short-pulse laser signal having a second wavelength picosecond short pulse 42 at a $6^{th}$ end of the wavelength filter 17.

Figure 3:
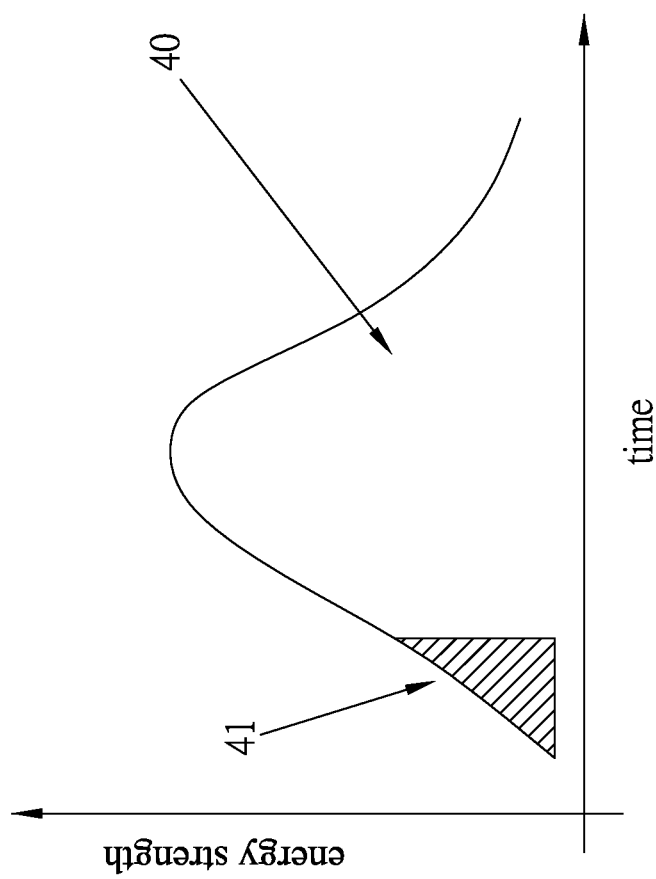
FIG. 3 is a schematic diagram of a first wavelength pulse and a sideband second wavelength pulse.
Figure 4:
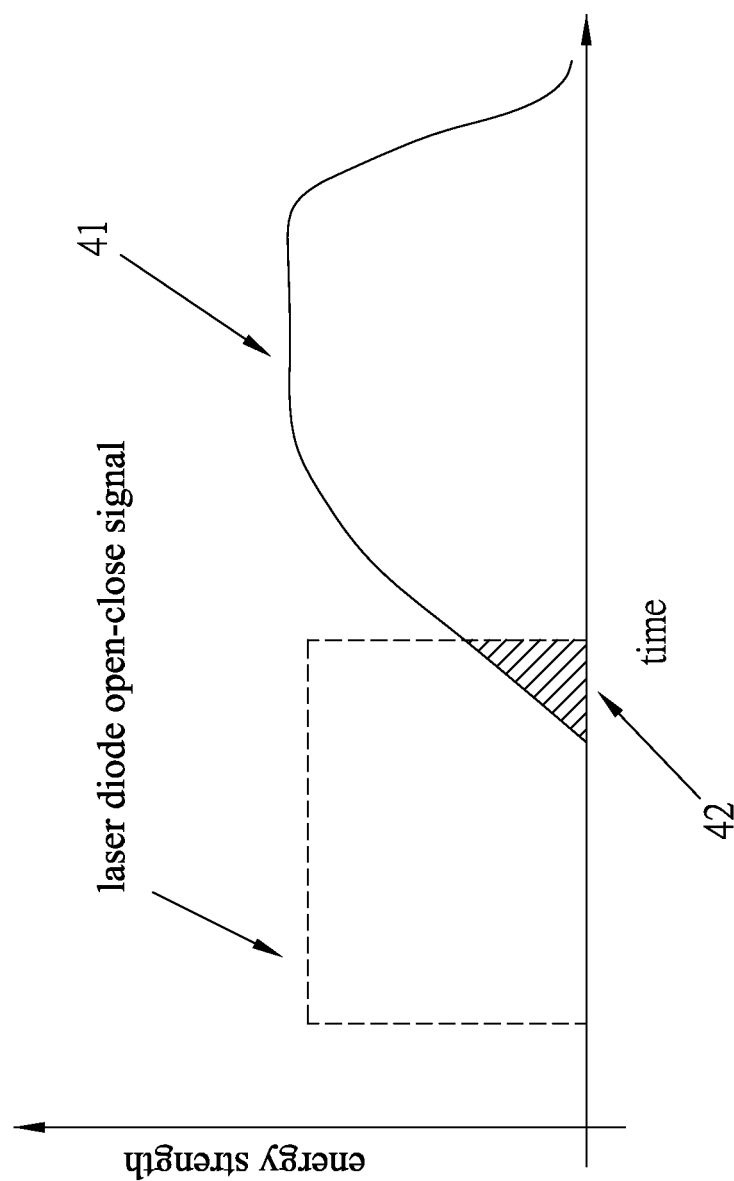
FIG. 4 is a schematic diagram of a laser diode open-close sampling a second wavelength picosecond pulse.

The laser diode 12 outputs the first wavelength pulse 40 at a first time point. When entering a second time point from the first time point, the first wavelength pulse 40 passes through the external reflector 40, and a sideband of the first wavelength pulse 40 is reflected to the laser diode 12 to form a second wavelength pulse 41, as shown in FIG. 3. The external reflector 21 then removes the first wavelength pulse 40. When entering a third time point from the second time point, the second wavelength pulse 41 falls within a retrieval period in which the laser diode 12 is turned off to form the second wavelength picosecond short pulse 42, as shown in FIG. 4. The laser signal strength of the second wavelength picosecond short pulse 42 is amplified via the laser diode 12. When entering a fourth time point from the third time point, the second wavelength picosecond short pulse 42 having the amplified signal strength is transmitted to the external reflector 21. When entering a fifth time point from the fourth time point, the second wavelength picosecond short pulse 42 having the amplified signal strength is transmitted via the external reflector 21 to the wavelength filter 17. When entering a sixth time point from the fifth time point, the wavelength filter 17 removes the laser signal having the first wavelength pulse 40, and outputs the single short-pulse laser signal having the second wavelength picosecond short pulse 42.

Through temperature control, the laser diode 12 adjusts a main wavelength in the first wavelength pulse 40 to correspondingly adjust the wavelength of the first wavelength pulse 40. The main wavelength in the first wavelength pulse 40 is a nanosecond optical source. The pulse driver modulator 11 provides a modulation range of between 1 and 1,000,000 times/second (Hz), and a pulse width range of between 1 ns and 100 μs. The pulse driver modulator 12 that generates the laser signal having the main wavelength in the first wavelength in nanoseconds outputs a wavelength range of between 800 nm and 1600 nm.

FIG. 5 shows a diagram of an apparatus for generating a short-pulse laser using a temporally modulated sideband gain according to a second embodiment. Referring to FIG. 5, an external reflector 21 includes an extension optical fiber 13, an optical fiber coupler 14, a reflection coupler 15 and a sideband filter 16. The extension optical fiber 13 has a $16^{th}$ end 37 connected to a $2^{nd}$ end 23 of a laser diode 12. The optical fiber coupler 14 has a $7^{th}$ end 28 connected to a $17^{th}$ end 38 of the extension optical fiber 13, and an $18^{th}$ end 39 connected to a $4^{th}$ end of the external reflector 21. The reflection coupler 15 has a $10^{th}$ end 31 connected to a $19^{th}$ end 45 formed by an input end of a loop optical fiber and also connected to a $20^{th}$ end 46 formed by an output end of the loop optical fiber. The sideband filter 16 has an input end forming an $11^{th}$ end 32 connected to the loop optical fiber, and transmits the laser signal inputted via a $19^{th}$ end 45 formed by an input end of the loop optical fiber to the $11^{th}$ end 32, and outputs the laser signal via a $12^{th}$ end 33 formed by an output end of the sideband filter 16 to the $20^{th}$ end 46 formed by the output end of the loop optical fiber.

The optical fiber coupler 14 has a light field division rate of 1% to 99%, and is for beam-splitting the nanosecond laser signal. The reflection coupler 15 has a light field division rate of 1% to 99%, and is for beam-splitting the laser signal. The sideband filter 16 has a filter range of 800 nm to 1600 nm. The laser signal inputted at the $11^{th}$ end 32 is filtered by the sideband filter 16 to select the sideband having the first wavelength pulse 40 to form the second wavelength pulse 41. After outputting the second wavelength pulse 41 from the $12^{th}$ end 33 formed by the output end of the sideband filter 16, the second wavelength pulse 41 sequentially passes through the reflection coupler 15 and the optical fiber coupler 14 to return to the laser diode 12.

FIG. 6 shows a diagram of an apparatus for generating a short-pulse laser using a temporally modulated sideband gain according to a third embodiment. As shown in FIG. 6, an external reflector 21 includes an extension optical fiber 13 and a second wavelength reflector 18. The extension optical fiber 13 has a $16^{th}$ end 37 connected to a $2^{nd}$ end 23 of a laser diode 12. The second wavelength reflector 18 has a $13^{th}$ end 34 connected to a $17^{th}$ end 38 of the extension optical fiber 13, and a $14^{th}$ end 35 connected to a $4^{th}$ end 25 of the external reflector 21. The second wavelength reflector 18, being an optical fiber grating or a coated optical fiber, partially reflects the second wavelength pulse 41 inputted into the second wavelength reflector 18, and transmits the partially reflected second wavelength pulse 41 via the extension optical fiber 13 to a $3^{rd}$ end 24 of the external reflector 21.

FIG. 7 shows a diagram of an apparatus for generating a short-pulse laser using a temporally modulated sideband gain according to a fourth embodiment. Referring to FIG. 7, an external reflector 21 includes an extension optical fiber 13, an optical fiber coupler 14 and a reflection mirror 19. The extension optical fiber 13 has a $16^{th}$ end 37 connected to a $2^{nd}$ end 23 of a laser diode 12. The optical fiber coupler 14 has a $7^{th}$ end 28 connected to a $17^{th}$ end 38 of the extension optical fiber 13, and a $17^{th}$ end 39 connected to a $4^{th}$ end 25 of the external reflector 21. The reflection mirror 19 has a $15^{th}$ end 36 connected to an $8^{th}$ end 29 of the optical fiber coupler 14. Further, the reflection mirror 19 reflects the second wavelength pulse 41 inputted into the second wavelength reflector 18, and transmits the reflected second wavelength pulse 41 via the optical fiber coupler 14 to a $3^{rd}$ end 24 of the external reflector 21.

In the above second, third and fourth embodiments, the external reflector 21 according to the first embodiment outputs the first wavelength pulse at the first time point via the laser diode 12. When entering the second time point from the first time point, the first wavelength pulse 40 passes through the external reflector 21, and the sideband of the first wavelength pulse 40 is reflected via the external reflector 21 to the laser diode 12 to form the second wavelength pulse 41. The external reflector 21 then removes the first wavelength pulse 40. When entering the third time point from the second time point, the second wavelength pulse 41 falls within a retrieval period in which the laser diode 12 is turned off to form the second wavelength picosecond short pulse 42. The laser signal strength of the second wavelength picosecond short pulse 42 is amplified via the laser diode 12. When entering the fourth time point from the third time point, the second wavelength picosecond short pulse 42 having the amplified signal strength is transmitted to the external reflector 21. When entering the fifth time point from the fourth time point, the second wavelength picosecond short pulse 42 having the amplified signal strength is transmitted via the external reflector 21 to the wavelength filter 17. When entering the sixth time point from the fifth time point, the wavelength filter 17 removes the laser signal having the first wavelength pulse 40, and outputs the single short-pulse laser signal having the second wavelength picosecond short pulse 42.

The extension optical fiber 13 in the second, third and fourth embodiments has an adjustable length, such that the time point at which the second wavelength pulse 41 reflected via the external reflector 20 enters the laser diode 12 allows the reflected second wavelength pulse 41 to fall within the retrieval period in which the laser diode 12 is turned off when the laser diode 12 enters the third time point from the second time point. Thus, the second wavelength picosecond short pulse 42 is formed, and the signal strength of the second wavelength picosecond short pulse 42 is also amplified after passing through the laser diode 12. Further, the retrieval period in which the laser diode 12 is turned off is also adjustable. Accordingly, as shown in FIG. 4, the time point at which the reflected second wavelength pulse 41 is transmitted to the laser diode 12 allows the reflected second wavelength pulse 41 to fall within the retrieval period in which the laser diode 12 is turned off when the laser diode 12 enters the third time point from the second time point to form the second wavelength picosecond short pulse 42.

Referring to FIG. 3, according to the second embodiment of the disclosure, when entering the second time point from the first time point, the sideband of the first wavelength pulse 40 in the laser signal inputted via the $11^{th}$ end is selected by the sideband filter 16 to form the second wavelength pulse 41. As shown in FIG. 3, the second wavelength pulse 41 is outputted from the $12^{th}$ end formed by the output end of the sideband filter 16, and returns back to the laser diode 12 after sequentially passing through the reflection coupler 15 and the optical fiber coupler 14. According to the third embodiment of the disclosure, when entering the second time point from the first time point, the second wavelength reflector 18 selects the sideband of the first wavelength pulse 40, partially reflects the second wavelength pulse 41 inputted into the second wavelength reflector 18, and transmits the partially reflected second wavelength pulse 41 via the extension optical fiber 13 to the $3^{rd}$ end of the external reflector 20 to return to the laser diode 12. According to the fourth embodiment of the disclosure, when entering the second time point from the first time point, the reflection mirror 19 selects the sideband of the first wavelength pulse 40, reflects the second wavelength pulse 41 inputted into the second wavelength reflector 18, and transmits the reflected second wavelength pulse 41 via the optical fiber coupler 14 to the $3^{rd}$ end of the external reflector 20 to return of the laser diode 12.

Figure 8:
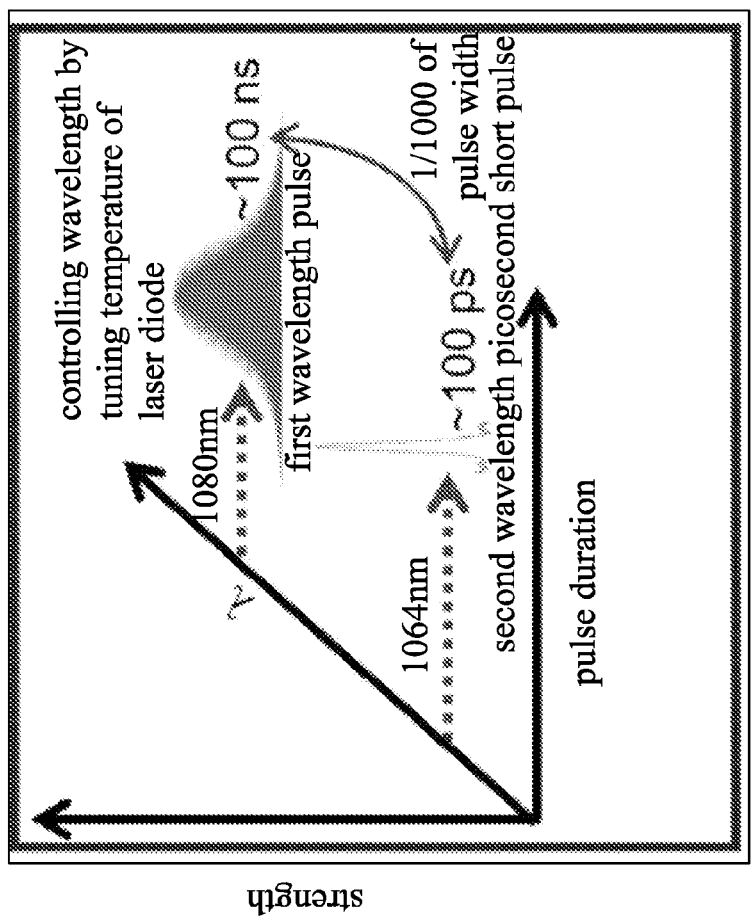
FIG. 8 is a schematic diagram of converting a nanosecond pulse in a first wavelength pulse to a picosecond short pulse in a second wavelength using a sideband gain.

Using a temperature drift approach cooperating with the programmed long-pulse first wavelength pulse 40, the laser repetition rate and the pulse width as well as a time difference produced by an external reflection cavity, the laser diode 12 of the embodiments generates and outputs a picosecond pulse in the second wavelength picosecond short pulse 42. Referring to FIG. 8, the vertical axis represents the pulse strength, and the horizontal axis represents the pulse duration. As shown in FIG. 8, the pulse duration of the first wavelength pulse 40 is approximately 100 ns, and the pulse duration of the second wavelength picosecond short pulse 42 is approximately 100 ps. Further, the remaining axis in FIG. 8 represents the wavelength controlled by a temperature drift approach cooperating with programmed laser repetition rate and pulse width of the long-pulse first wavelength pulse 40. The wavelength controlled by the temperature drift approach ranges between 1064 nm and 1080 nm.

Figure 9:
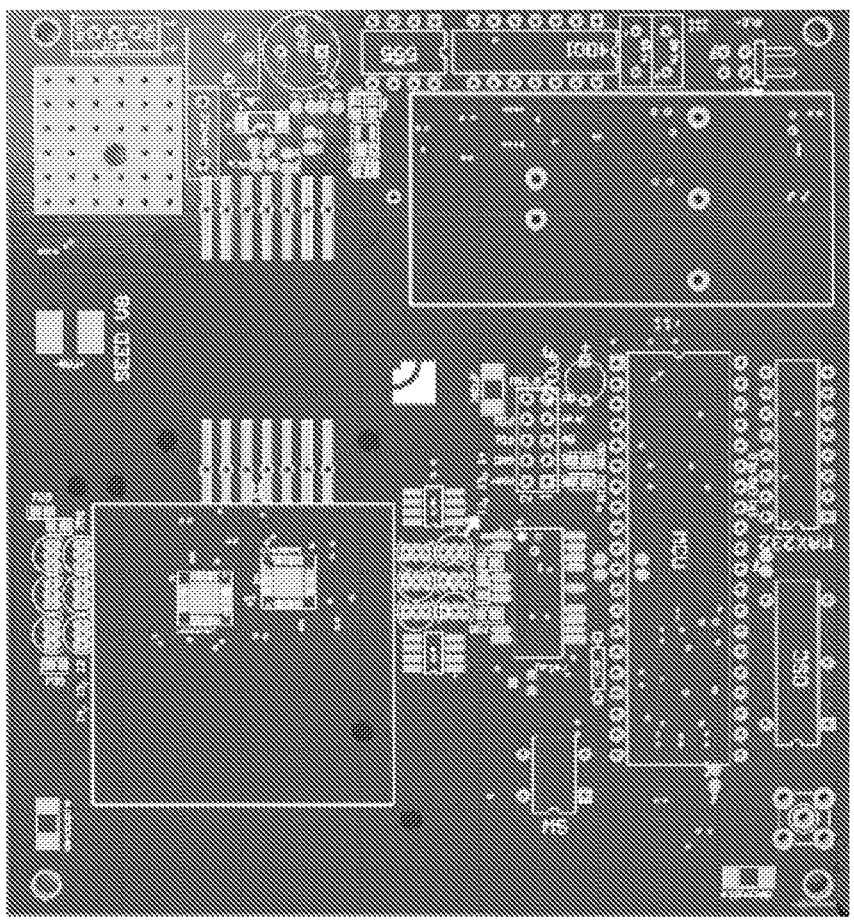
FIG. 9 is an electronic driver board of an apparatus for generating a short-pulse laser using a temporally modulated sideband gain according to an embodiment.

FIG. 9 shows an electronic driver board of an apparatus for generating a short-pulse laser using a temporally modulated sideband gain according to an embodiment. The electronic driver board has an adjustable output laser signal wavelength, and is capable of controlling stability and safety of the laser diode 12. The electronic driver board further has an adjustable repetition rate between kHz to MHz and a pulse range greater than 20 ns.

Figure 10:
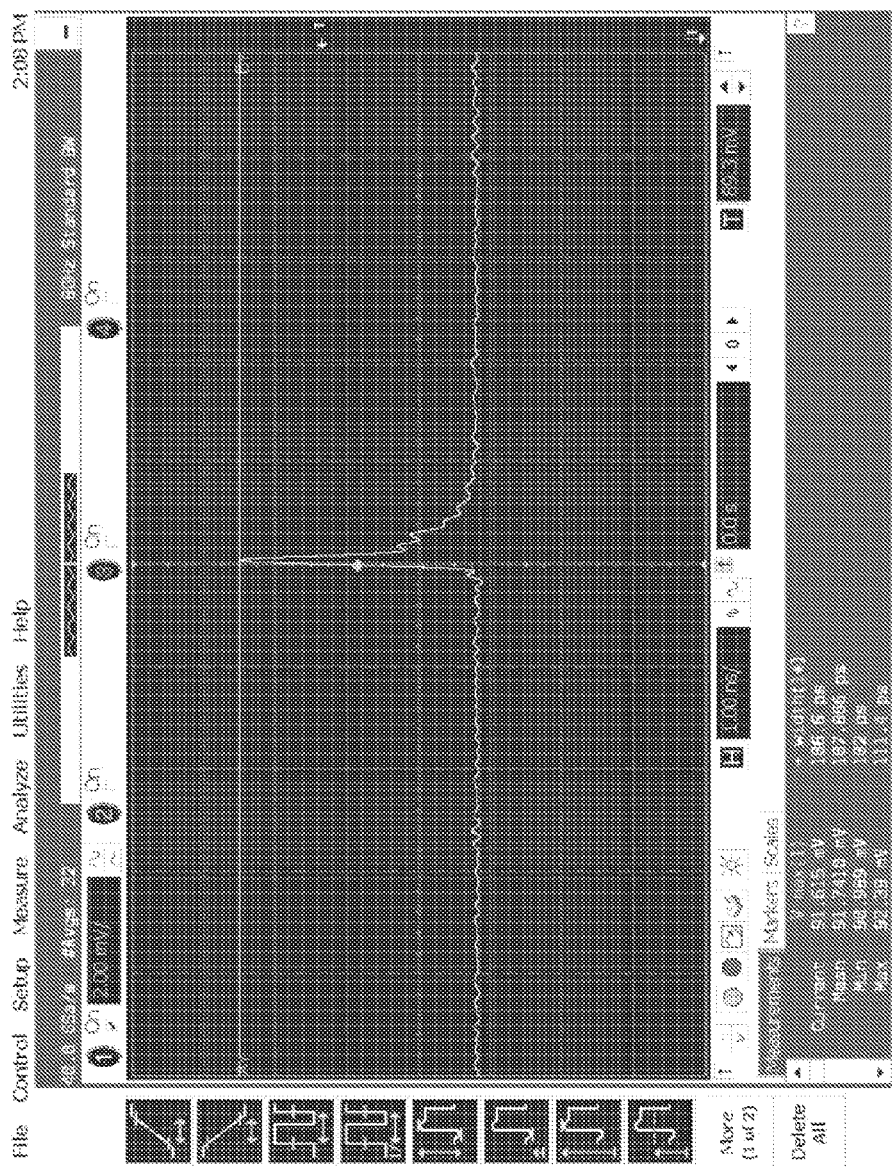
FIG. 10 is an oscilloscope diagram of an output of a second wavelength picosecond short pulse according to an embodiment.

FIG. 10 shows an oscilloscope diagram of an output of the electronic driver board in FIG. 9. As shown in FIG. 10, the second wavelength picosecond short pulse 42 measured is 107 ps.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An apparatus for generating a short-pulse laser using a temporally modulated sideband gain, comprising:
   at least one pulse driver modulator;
   a laser diode, having one end connected to the pulse driver modulator, and having a nanosecond pulse repetition rate and a pulse width of a programmable semiconductor optical output;
   an external reflector, having one input end connected to one output end of the laser diode; and
   a wavelength filter, having one end connected to one output end of the external reflector, wherein the laser diode outputs a long-pulse laser signal having a first wavelength pulse, and a sideband of the first wavelength pulse is reflected via the external reflector to the laser diode to form a second wavelength pulse, and the second wavelength pulse falls within a retrieval period in which the laser diode is turned off to form a second wavelength picosecond short pulse due to a time difference that the external reflector reflected the sideband of the first wavelength pulse, and then the second wavelength picosecond short pulse is filtered by the wavelength filter to generate a single short-pulse laser signal having the second wavelength pulse.

2. The apparatus according to claim 1, wherein:
at a first time point, the laser diode outputs the first wavelength pulse;
when entering a second time point from the first time point, the first wavelength pulse passes the external reflector, the sideband of the first wavelength pulse is reflected via the external reflector to the laser diode to form the second wavelength pulse, and the external reflector removes the first wavelength pulse;
when entering a third time point from the second time point, the second wavelength pulse falls within a retrieval period in which the laser diode is turned off to form the second wavelength picosecond short pulse, and laser signal strength of the second wavelength picosecond short pulse is amplified via the laser diode;
when entering a fourth time point from the third time point, the second wavelength picosecond short pulse having the amplified signal strength is transmitted to the external reflector;
when entering a fifth time point from the fourth time point, the second wavelength picosecond short pulse having the amplified signal strength is transmitted via the external reflector to the wavelength filter; and
when entering a sixth time point from the fifth time point, the wavelength filter removes the laser signal having the first wavelength pulse, and outputs the single short-pulse laser signal having the second wavelength picosecond short pulse.

3. The apparatus according to claim 2, wherein the laser adjusts a wavelength of a main wavelength in the first wavelength pulse through temperature control to correspondingly adjust a wavelength of the first wavelength pulse, and the main wavelength in the first wavelength pulse is a nanosecond optical source.

4. The apparatus according to claim 3, wherein the pulse driver modulator provides a modulation range of between 1 and 1,000,000 times/second (Hz), and a pulse width range of between 1 ns and 100 μs.

5. The apparatus according to claim 4, wherein the pulse driver modulator for generating the laser signal having the main wavelength in the first wavelength in nanoseconds outputs a wavelength range of between 800 nm and 1600 nm.

6. An apparatus for generating a short-pulse laser using a temporally modulated sideband gain, comprising:
at least one pulse driver modulator;
a laser diode, having one end connected to the pulse driver modulator, and having a nanosecond pulse repetition rate and a pulse width of a programmable semiconductor optical output;
an external reflector, having one input end connected to one output end of the laser diode; and
a wavelength filter, having one end connected to one output end of the external reflector, wherein the laser diode outputs a long-pulse laser signal having a first wavelength pulse, and a sideband of the first wavelength pulse is reflected via the external reflector to the laser diode to form a second wavelength pulse, and the second wavelength pulse falls within a retrieval period in which the laser diode is turned off to form a second wavelength picosecond short pulse due to a time difference that the external reflector reflected the sideband of the first wavelength pulse, and then the second wavelength picosecond short pulse is filtered by the wavelength filter to generate a single short-pulse laser signal having the second wavelength pulse;
wherein, the external reflector comprises:
an extension optical fiber, having one end connected to one end of the laser diode;
an optical fiber coupler, having one end connected to one end of the extension optical fiber, and one other end connected to one end of the external reflector;
a reflection coupler, having one end connected to one input end of a loop optical fiber, and one other end connected to one output end of the loop optical fiber; and
a sideband filter, having one input end connected to the loop optical fiber, for inputting the laser signal inputted via an input end of the loop optical fiber to one end thereof, and outputting the laser signal to one output end of the loop optical fiber via one output end thereof.

7. The apparatus according to claim 6, wherein:
at a first time point, the laser diode outputs the first wavelength pulse;
when entering a second time point from the first time point, the first wavelength pulse passes the external reflector, the sideband of the first wavelength pulse is reflected via the external reflector to the laser diode to form the second wavelength pulse, and the external reflector removes the first wavelength pulse;
when entering a third time point from the second time point, the second wavelength pulse falls within the retrieval period in which the laser diode is turned off to form the second wavelength picosecond short pulse, and laser signal strength of the second wavelength picosecond short pulse is amplified via the laser diode;
when entering a fourth time point from the third time point, the second wavelength picosecond short pulse having the amplified signal strength is transmitted to the external reflector;
when entering a fifth time point from the fourth time point, the second wavelength picosecond short pulse having the amplified signal strength is transmitted via the external reflector to the wavelength filter; and
when entering a sixth time point from the fifth time point, the wavelength filter removes the laser signal having the first wavelength pulse, and outputs the single short-pulse laser signal having the second wavelength picosecond short pulse.

8. The apparatus according to claim 7, wherein the laser adjusts a wavelength of a main wavelength in the first wavelength pulse through temperature control to correspondingly adjust a wavelength of the first wavelength pulse, and the main wavelength in the first wavelength pulse is a nanosecond optical source.

9. The apparatus according to claim 8, wherein the pulse driver modulator provides a modulation range of between 1 and 1,000,000 times/second (Hz), and a pulse width range of between 1 ns and 100 μs.

10. The apparatus according to claim 9, wherein the laser diode for generating the laser signal having the main wavelength in the first wavelength in nanoseconds outputs a wavelength range of between 800 nm and 1600 nm.

11. The apparatus according to claim 10, wherein the optical fiber coupler has a light field division rate of 1% to 99% for beam-splitting the nanosecond laser signal.

12. The apparatus according to claim 11, wherein the reflection coupler has a light field division rate of 1% to 99% for beam-splitting the laser signal.

13. The apparatus according to claim 12, wherein the sideband filter has a filter range of 800 nm to 1600 nm; the laser signal inputted at an 11th end is filtered by the sideband filter to select the sideband having the first wavelength pulse to form the second wavelength pulse; and after outputting the second wavelength pulse by one output end of the sideband filter, the second wavelength pulse sequentially passes through the reflection coupler and the optical fiber coupler to return to the laser diode.

14. An apparatus for generating a short-pulse laser using a temporally modulated sideband gain, comprising:
at least one pulse driver modulator;
a laser diode, having one end connected to the pulse driver modulator, and having a nanosecond pulse repetition rate and a pulse width of a programmable semiconductor optical output;
an external reflector, having one input end connected to one output end of the laser diode; and
a wavelength filter, having one end connected to one output end of the external reflector, wherein the laser diode outputs a long-pulse laser signal having a first wavelength pulse, and a sideband of the first wavelength pulse is reflected via the external reflector to the laser diode to form a second wavelength pulse, and the second wavelength pulse falls within a retrieval period in which the laser diode is turned off to form a second wavelength picosecond short pulse due to a time difference that the external reflector reflected the sideband of the first wavelength pulse, and then the second wavelength picosecond short pulse is filtered by the wavelength filter to generate a single short-pulse laser signal having the second wavelength pulse;
wherein, the external reflector comprises:
an extension optical fiber, having one end connected to one end of the laser diode; and
a second wavelength reflector, having one end connected to one end of the extension optical fiber and one other end connected to a 4th output of the external reflector.

15. The apparatus according to claim 14, wherein:
at a first time point, the laser diode outputs the first wavelength pulse;
when entering a second time point from the first time point, the first wavelength pulse passes the external reflector, the sideband of the first wavelength pulse is reflected via the external reflector to the laser diode to form the second wavelength pulse, and the external reflector removes the first wavelength pulse;
when entering a third time point from the second time point, the second wavelength pulse falls within the retrieval period in which the laser diode is turned off to form the second wavelength picosecond short pulse, and laser signal strength of the second wavelength picosecond short pulse is amplified via the laser diode;
when entering a fourth time point from the third time point, the second wavelength picosecond short pulse having the amplified signal strength is transmitted to the external reflector;
when entering a fifth time point from the fourth time point, the second wavelength picosecond short pulse having the amplified signal strength is transmitted via the external reflector to the wavelength filter; and
when entering a sixth time point from the fifth time point, the wavelength filter removes the laser signal having the first wavelength pulse, and outputs the single short-pulse laser signal having the second wavelength picosecond short pulse.

16. The apparatus according to claim 15, wherein the laser adjusts a wavelength of a main wavelength in the first wavelength pulse through temperature control to correspondingly adjust a wavelength of the first wavelength pulse, and the main wavelength in the first wavelength pulse is a nanosecond optical source.

17. The apparatus according to claim 16, wherein the pulse driver modulator provides a modulation range of between 1 and 1,000,000 times/second (Hz), and a pulse width range of between 1 ns and 100 μs.

18. The apparatus according to claim 17, wherein the laser diode for generating the laser signal having the main wavelength in the first wavelength in nanoseconds outputs a wavelength range of between 800 nm and 1600 nm.

19. The apparatus according to claim 18, wherein the second wavelength reflector is an optical fiber grating or a coated optical fiber for partially reflecting the second wavelength pulse inputted into the second wavelength reflector, and transmitting the partially reflected second wavelength pulse via the extension optical fiber to one end of the external reflector.

20. An apparatus for generating a short-pulse laser using a temporally modulated sideband gain, comprising:
at least one pulse driver modulator;
a laser diode, having one end connected to the pulse driver modulator, and having a nanosecond pulse repetition rate and a pulse width of a programmable semiconductor optical output;
an external reflector, having one input end connected to one output end of the laser diode; and
a wavelength filter, having one end connected to one output end of the external reflector, wherein the laser diode outputs a long-pulse laser signal having a first wavelength pulse, and a sideband of the first wavelength pulse is reflected via the external reflector to the laser diode to form a second wavelength pulse, and the second wavelength pulse falls within a retrieval period in which the laser diode is turned off to form a second wavelength picosecond short pulse due to a time difference that the external reflector reflected the sideband of the first wavelength pulse, and then the second wavelength picosecond short pulse is filtered by the wavelength filter to generate a single short-pulse laser signal having the second wavelength pulse;
wherein, the external reflector comprises:
an extension optical fiber, having one end connected to one end of the laser diode; an optical fiber coupler, having one end connected to one end of the extension optical fiber, and one other end connected to one end of the external reflector; and a reflection mirror, having one end connected to one end of the optical fiber coupler.

21. The apparatus according to claim 20, wherein:
at a first time point, the laser diode outputs the first wavelength pulse;
when entering a second time point from the first time point, the first wavelength pulse passes the external reflector, the sideband of the first wavelength pulse is reflected via the external reflector to the laser diode to form the second wavelength pulse, and the external reflector removes the first wavelength pulse;
when entering a third time point from the second time point, the second wavelength pulse falls within the retrieval period in which the laser diode is turned off to form the second wavelength picosecond short pulse, and laser signal strength of the second wavelength picosecond short pulse is amplified via the laser diode;

when entering a fourth time point from the third time point, the second wavelength picosecond short pulse having the amplified signal strength is transmitted to the external reflector;

when entering a fifth time point from the fourth time point, the second wavelength picosecond short pulse having the amplified signal strength is transmitted via the external reflector to the wavelength filter; and when entering a sixth time point from the fifth time point, the wavelength filter removes the laser signal having the first wavelength pulse, and outputs the single short-pulse laser signal having the second wavelength picosecond short pulse.

22. The apparatus according to claim 21, wherein the laser adjusts a wavelength of a main wavelength in the first wavelength pulse through temperature control to correspondingly adjust a wavelength of the first wavelength pulse, and the main wavelength in the first wavelength pulse is a nanosecond optical source.

23. The apparatus according to claim 22, wherein the pulse driver modulator provides a modulation range of between 1 and 1,000,000 times/second (Hz), and a pulse width range of between 1 ns and 100 μs.

24. The apparatus according to claim 22, wherein the laser diode for generating the laser signal having the main wavelength in the first wavelength in nanoseconds outputs a wavelength range of between 800 nm and 1600 nm.

25. The apparatus according to claim 24, wherein the reflection mirror reflects the second wavelength pulse inputted into the second wavelength reflector, and transmits the reflected second wavelength pulse via the optical fiber coupler to one end of the external reflector.

* * * * *